United States Patent
Yeh et al.

(10) Patent No.: US 8,896,055 B2
(45) Date of Patent: Nov. 25, 2014

(54) ACCUMULATION TYPE FINFET, CIRCUITS AND FABRICATION METHOD THEREOF

(75) Inventors: Chih Chieh Yeh, Taipei (TW);
Chih-Sheng Chang, Hsinchu (TW);
Clement Hsingjen Wann, Carmel, NY (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 104 days.

(21) Appl. No.: 13/585,436

(22) Filed: Aug. 14, 2012

(65) Prior Publication Data
US 2012/0306002 A1    Dec. 6, 2012

Related U.S. Application Data

(63) Continuation of application No. 12/757,271, filed on Apr. 9, 2010, now Pat. No. 8,264,032.

(60) Provisional application No. 61/238,828, filed on Sep. 1, 2009.

(51) Int. Cl.
*H01L 21/336* (2006.01)
*H01L 27/088* (2006.01)
*H01L 29/78* (2006.01)
*H01L 29/66* (2006.01)
*H01L 21/8234* (2006.01)

(52) U.S. Cl.
CPC ...... *H01L 29/7851* (2013.01); *H01L 29/66795* (2013.01); *H01L 29/7848* (2013.01); *H01L 21/823431* (2013.01); *H01L 2029/7857* (2013.01)
USPC .............. 257/327; 257/E21.409; 257/E27.06; 257/E29.255; 438/197

(58) Field of Classification Search
USPC ............. 257/327, E21.409, E27.06, E29.255; 438/197
See application file for complete search history.

(56) References Cited

U.S. PATENT DOCUMENTS 5,581,202 A    12/1996    Yano et al.
5,658,417 A    8/1997    Watanabe et al.
(Continued)

FOREIGN PATENT DOCUMENTS

CN    1945829    4/2004
CN    101179046    5/2005
(Continued)

OTHER PUBLICATIONS

Office Action dated Jan. 29, 2013 from corresponding application No. JP 2010-194220.

(Continued)

*Primary Examiner* — Victor A Mandala
(74) *Attorney, Agent, or Firm* — Lowe Hauptman & Ham, LLP

(57) ABSTRACT

This description relates to a fin field-effect-transistor (Fin-FET) including a substrate and a fin structure on the substrate. The fin structure includes a channel between a source and a drain, wherein the source, the drain, and the channel have a first type dopant, and the channel comprises at least one of a Ge, SiGe, or III-V semiconductor. The FinFET further includes a gate dielectric layer over the channel and a gate over the gate dielectric layer. The FinFET further includes a nitride spacer on the substrate adjacent the gate and an oxide layer between the nitride spacer and the gate and between the nitride spacer and the substrate.

20 Claims, 6 Drawing Sheets

(56) References Cited

U.S. PATENT DOCUMENTS

| | | |
|---|---|---|
| 5,767,732 A | 6/1998 | Lee et al. |
| 5,963,789 A | 10/1999 | Tsuchiaki |
| 6,065,481 A | 5/2000 | Fayfield et al. |
| 6,121,786 A | 9/2000 | Yamagami et al. |
| 6,299,724 B1 | 10/2001 | Fayfield et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,713,365 B2 | 3/2004 | Lin et al. |
| 6,727,557 B2 | 4/2004 | Takao |
| 6,740,247 B1 | 5/2004 | Han et al. |
| 6,743,673 B2 | 6/2004 | Watanabe et al. |
| 6,762,448 B1 | 7/2004 | Lin et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,964,832 B2 | 11/2005 | Moniwa et al. |
| 7,009,273 B2 | 3/2006 | Inoh et al. |
| 7,026,232 B1 | 4/2006 | Koontz et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 * | 9/2006 | Ko et al. ............ 438/300 |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,259,050 B2 | 8/2007 | Chen et al. |
| 7,265,008 B2 | 9/2007 | King et al. |
| 7,265,418 B2 | 9/2007 | Yun et al. |
| 7,297,600 B2 | 11/2007 | Oh et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,361,563 B2 | 4/2008 | Shin et al. |
| 7,374,986 B2 | 5/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,605,449 B2 | 10/2009 | Liu et al. |
| 7,682,911 B2 | 3/2010 | Jang et al. |
| 7,795,097 B2 | 9/2010 | Pas |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,321 B2 | 4/2011 | Lai et al. |
| 7,960,791 B2 | 6/2011 | Anderson et al. |
| 7,989,846 B2 | 8/2011 | Furuta |
| 7,989,855 B2 * | 8/2011 | Narihiro ............ 257/288 |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2003/0080361 A1 | 5/2003 | Murthy et al. |
| 2003/0109086 A1 | 6/2003 | Arao |
| 2003/0234422 A1 | 12/2003 | Wang et al. |
| 2004/0075121 A1 | 4/2004 | Yu et al. |
| 2004/0129998 A1 | 7/2004 | Inoh et al. |
| 2004/0185618 A1 | 9/2004 | Yaegashi et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0035415 A1 | 2/2005 | Yeo et al. |
| 2005/0051865 A1 | 3/2005 | Lee et al. |
| 2005/0054164 A1 * | 3/2005 | Xiang ............ 438/285 |
| 2005/0077550 A1 | 4/2005 | Inaba et al. |
| 2005/0153490 A1 | 7/2005 | Yoon et al. |
| 2005/0170593 A1 | 8/2005 | Kang et al. |
| 2005/0224800 A1 | 10/2005 | Lindert et al. |
| 2005/0224890 A1 | 10/2005 | Bernstein et al. |
| 2005/0233598 A1 | 10/2005 | Jung et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0153995 A1 | 7/2006 | Narwankar et al. |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 * | 3/2007 | Lee et al. ............ 438/142 |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0099370 A1 * | 5/2007 | Nakajima et al. ........ 438/199 |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2008/0001171 A1 | 1/2008 | Tezuka et al. |
| 2008/0036001 A1 | 2/2008 | Yun et al. |
| 2008/0050865 A1 * | 2/2008 | Jeong-hwan ............ 438/157 |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0251831 A1 | 10/2008 | Wu et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0026553 A1 * | 1/2009 | Bhuwalka et al. ............ 257/402 |
| 2009/0066763 A1 | 3/2009 | Fujii et al. |
| 2009/0181477 A1 | 7/2009 | King et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |

(56) References Cited

U.S. PATENT DOCUMENTS

| | | | |
|---|---|---|---|
| 2011/0256682 A1 | 10/2011 | Yu et al. | |
| 2012/0068273 A1* | 3/2012 | Fischer et al. | 257/369 |
| 2013/0005106 A1* | 1/2013 | Tezuka et al. | 438/299 |

FOREIGN PATENT DOCUMENTS

| | | |
|---|---|---|
| CN | 101315933 | 12/2008 |
| CN | 1011459116 | 6/2009 |
| JP | 10-223901 | 8/1998 |
| JP | 2007-194336 | 8/2007 |
| KR | 10-2005-0119424 | 12/2005 |
| KR | 1020070064231 | 6/2007 |
| TW | 497253 | 8/2002 |
| TW | 200805660 | 1/2008 |
| TW | 200905875 | 2/2009 |
| WO | WO 2007/046150 | 4/2007 |
| WO | WO2007/115585 | 10/2007 |

OTHER PUBLICATIONS

Office Action dated Dec. 11, 2012 from corresponding application No. CN 201010263802.3.

Endo, Kazuhiko et al., "Experimental Evaluation of Effects of Channel Doping on Characteristics of FinFETs", IEEE Electron Device Letters, vol. 28, No. 12, Dec. 2007, pp. 1123-1125.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Chui, King-Jien, et al., "Source/Drain Germanium Condensation for P-Channel Strained Ultra-Thin Body Transistors", Silicon Nano Device lab, Dept. of Electrical and Computer Engineering, National University of Singapore, IEEE 2005.

Shikida, Mitsuhiro, et al., "Comparison of Anisotropic Etching Properties Between KOH and TMAH Solutions", IEEE Xplore, Jun. 30, 2010, pp. 315-320.

Lenoble, Damien, STMicroelectronics, Crolles Cedex, France, "Plasma Doping as an Alternative Route for Ultra-Shallow Junction Integration to Standard CMOS Technologies", 2001, Semiconductor Fabtech—16th Edition, pp. 1-5.

Anathan, Hari, et al., "FinFet SRAM—Device and Circuit Design Considerations", Quality Electronic Design, 2004, Proceedings 5th International Symposium (2004); pp. 511-516.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Office Action dated Aug. 14, 2013 from corresponding application No. TW 099128794.

Office Action dated May 2, 2012 from corresponding application No. CN 201010196345.0.

Office Action dated May 4, 2012 from corresponding application No. CN 201010243667.6.

Office Action dated Jan. 2, 2014 and English translation from corresponding application No. KR 10-2010-0077470.

Office Action dated Jul. 14, 2014 and English translation from corresponding No. KR 10-2014-0074989.

\* cited by examiner

ACCUMULATION TYPE FINFET, CIRCUITS AND FABRICATION METHOD THEREOF

CROSS-REFERENCE TO RELATED APPLICATIONS

The present application is a continuation application of U.S. patent application Ser. No. 12/757,271, filed on Apr. 9, 2010, which claims priority of U.S. Provisional Patent Application Ser. No. 61/238,828, filed on Sep. 1, 2009, both of which are incorporated herein by reference in their entireties.

RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser No. 12/731,325, filed on Mar. 25, 2010, titled ELECTRICAL FUSE AND RELATED APPLICATIONS; Ser. No.12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

This disclosure relates generally to a semiconductor device, more particularly accumulation type FinFETs.

BACKGROUND

As the integrated circuit size is reduced, there were efforts to overcome problems faced with such size reduction. For example, the performance of a MOSFET is degraded from reduced channel length, including leakage current. Therefore, new methods and structures to improve the MOSFET performance are desired.

BRIEF DESCRIPTION OF THE DRAWINGS

For a more complete understanding of the embodiment, and the advantages thereof, reference is now made to the following descriptions taken in conjunction with the accompanying drawings, in which.

DETAILED DESCRIPTION OF ILLUSTRATIVE EMBODIMENTS

The making and using of some embodiments are discussed in detail below. It should be appreciated, however, that the present embodiment provides many applicable novel concepts that can be embodied in a wide variety of specific contexts. The specific embodiments discussed are merely illustrative of specific ways to make and use the embodiment, and do not limit the scope of the invention.

Certain planar MOSFET using different material other than Si, e.g. Ge planar MOS device has advantage over conventional Si planar MOS device, e.g. high carrier (electron/hole) mobility about 2.6/4 times higher than Si. It is found that Ge planar MOS device faces issues: 1) lower energy gap $E_g$ and high subthreshold leakage current $I_{sub}$, 2) high dielectric constant $\in$ and short channel effect (SCE), and 3) high interface defects (Nit) causing poor carrier mobility $\mu$ in Ge NMOS.

When the channel length is shrinking down, the planar MOSFET can have the channel length that is in the same order of magnitude as the depletion-layer widths of the source and drain junction thereof. SCE degrade the performance compared to other MOSFETs. As the channel length is reduced to increase both the operation speed and the number of components per chip, the SCE arise. The SEC can be attributed to two physical phenomena: 1) the limitation imposed on electron drift characteristics in the channel, and 2) the modification of the threshold voltage due to the shortening channel length. SCE includes: 1) drain-induced barrier lowering (DIBL) and punch through, 2) surface scattering, 3) velocity saturation, 4) impact ionization, and 5) hot electrons. In particular, Ge planar-type MOS shows worse DIBL due to higher E.

In the Ge NMOS, high Nit density is observed at the interface between the dielectric film layer and Ge near conduction band (Ec), which degrades electron mobility significantly. GeO (or other dielectric films) and Ge do not have desired interface compared to $SiO_2$ and Si system, where $SiO_2$/Si has good interface that provides desired interface quality and low Nit for Si MOS.

Figure 1A:
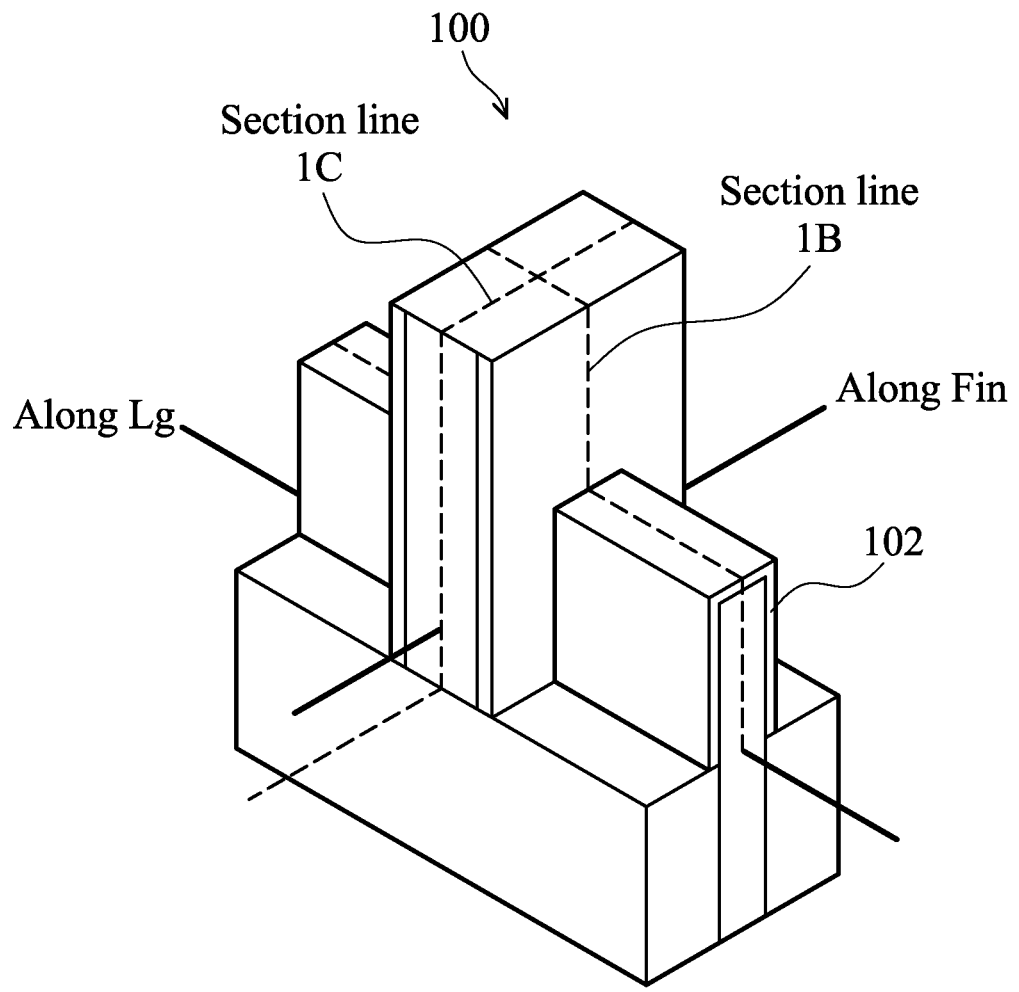
FIG. 1A illustrates a schematic of a FinFET showing different cross-section directions for FIG. 1B-FIG. 1C.
Figure 1B:
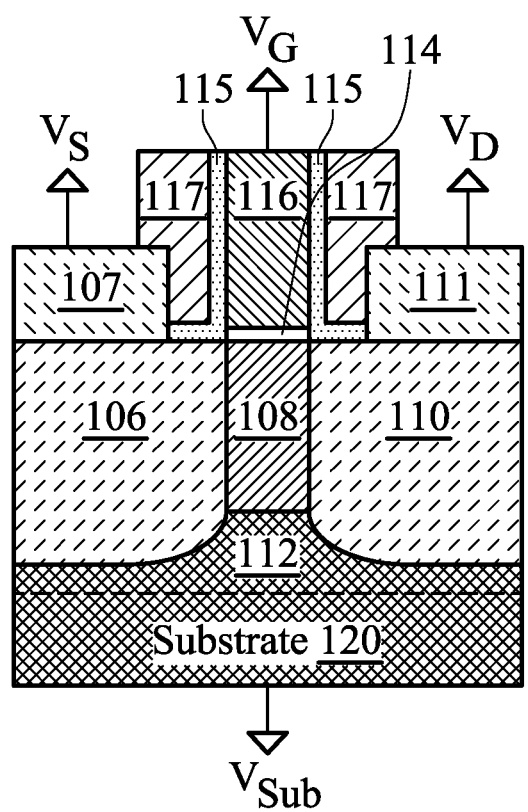
FIG. 1B-FIG. 1C illustrate cross sections of an accumulation type FinFET according to one aspect of the embodiment.
Figure 1C:
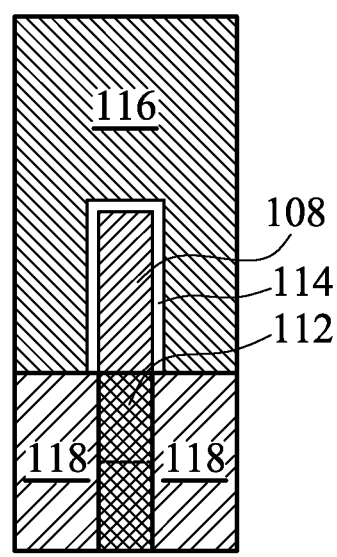

From the foregoing, MOSFET structures and methods for forming the MOSFET structures are desired. In exemplary embodiments, an accumulation type FinFET device is provided to improve MOSFET performances. FIG. 1A illustrates a schematic drawing of an exemplary FinFET. In FIG. 1A, the FinFET 100 can include a fin structure 102. FIG. 1B-FIG. 1C illustrate cross sectional views of the accumulation-type Fin-FET 100 of FIG. 1A taken along section lines 1B and 1C, respectively. In FIG. 1A-FIG. 1B, the accumulation-type Fin-FET 100 shows a substrate 120 and a fin structure 102 on the substrate 120. The fin structure 102 includes a channel 108 between a source 106 and a drain 110. The source 106, the drain 110, and the channel 108 have the first type dopant. A well 112 under the source 106, the drain 110, and the channel 108 has the second type dopant. The channel 108 comprises Ge, SiGe, or III-V semiconductor. A gate dielectric layer 114 is located over the channel 108. A gate 116 is located over the gate dielectric layer 114.

In an embodiment forming an N-type accumulation Ge FinFET, the source 106, e.g., an n+ source region, can be connected to a source voltage $V_S$ through a silicide 107. The channel 108, e.g., an n-0 channel region, can comprise, for example, a Ge fin region. The drain 110, e.g., an n+ drain region, can be connected to a drain voltage $V_D$ through silicide 111. A well 112, e.g., p-type well, can provide electrical isolation from other devices. The gate dielectric layer 114 can comprise oxide, nitride, oxynitride, high-k dielectric, or any combinations thereof. The gate 116, e.g., a metal gate, is connected to a gate voltage $V_G$. The oxide layer 115 and the nitride spacer 117 are shown beside the gate 116. The substrate 120 can comprise Si, Ge, SiGe, III-V compound, and/or any combinations thereof. Examples of the high-k dielectric material can include hafnium silicate, zirconium silicate, hafnium dioxide, zirconium dioxide, other high-k dielectric material, or any combinations thereof. In other embodiments, the channel 108 can comprise SiGe or III-V semiconductor materials, e.g. AlGaAs, InGaAs, etc.

In FIG. 1C, the cross-sectional view of the accumulation-type FinFET 100 shows the channel 108, the gate dielectric layer 114, and the gate 116. The well 112 under the fin provides electrical isolation. In one embodiment, the channel 108, e.g. n⁻ channel, comprises a Ge fin region. The well 112, e.g. p-well, provides electrical isolation. The gate 116 can be disposed over the gate dielectric layer 114. Shallow trench isolation (STI) 118 can be formed adjacent to the well 112. In other embodiments, the channel 108 can comprise SiGe or III-V semiconductor materials, e.g. AlGaAs, InGaAs, etc.

With an accumulation N-type FinFET 102, the channel 108, the source 106 and the drain 110 can have n-type dopants. In another embodiment for an accumulation P-type PMOS device, the channel 108, the source 106, and the drain 110 can have p-type dopants. The accumulation type FinFET can change electron/hole profile and Fermi level ($E_F$) location that suppresses the effects of interface defects Nit. Also, SiGe stressors can be incorporated to the Ge FinFET NMOS to improve performance.

For a conventional inversion type NMOS (with p-channel), electrons pile up at the interface and the device may suffer a mobility degradation due to Nit. Contrary to the conventional inversion-type NMOS, for an accumulation type NMOS, bulk inversion reduces the effect of Nit that can degrade sub-threshold current swing and electron mobility. Bulk inversion means that most inversion charges are located at bulk Fin region in the middle of the Fin in FIG. 1C as bulk electrons while most electrons are plied up at gate-dielectric/Fin surface as surface electrons in the conventional surface inversion type device. Using $V_G$=VDD, Fermi level of accumulation is nearer to the mid-bandgap (Eg), and the effects of Nit can be substantially reduced.

It is found that the channel dopant concentration and/or the voltage VDD applied to the drain 110 may affect electrical performances of the accumulation-type FinFET 100. For example, in one embodiment for NMOS/PMOS, the counter doping density in channel is n-type/p-type 1e18 $cm^{-3}$~3e18 $cm^{-3}$ and the VDD is 0.5V. In an NMOS accumulation-type device, n-type channel can decrease Fermi level ($E_F$), increase bulk electron density, thus reduces the effects of surface Nit. For example, in one embodiment of an accumulation type NMOS, the electron density is 7.1e12 $cm^{-2}$, compared to an inversion type NMOS at 6.7e12 $cm^{-2}$. Also, low VDD shifts $E_F$ toward mid-bandgap, increases bulk electron/hole percentage, and reduces the effects of surface Nit in NMOS/PMOS.

Ge and III-V semiconductor channel materials, e.g. AlGaAs, InGaAs, etc., can provide higher carrier mobility than Si. FinFET architecture provides better gate control, lower leakage currents and better scalability. The substrate 120 can be Si or Ge substrate wafer. Above the substrate 120, Ge epi can be performed to form Ge-fin for the channel 108 in one embodiment. In an NMOS embodiment, Ge can be also used for the source 106 or drain 110. In some embodiments, a SiGe or Si source/drain is used since SiGe or Si source/drain would result in tensile stress in the channel 108, e.g. Ge channel, to boost electron mobility. In PMOS source/drain region, Ge can be also used. In some embodiments, GeSn, SiGeSn or III-V semiconductor source/drain is used, since GeSn, SiGeSn or III-V semiconductor source/drain would result in compressive stress in the channel 108, e.g. Ge channel, to boost hole mobility.

The FinFET structure with Ge fin channel region 108 can help to reduce the SCE caused by high ∈. FinFET architecture can suppress leakage current in accumulation type device significantly. Compared to planar devices, FinFET structure can reduce the band-to-band tunneling (BTBT) leakage current significantly by lower channel doping (e.g. ~1e17 $cm^{-3}$) and reduced power supply voltage VDD.

Figure 2:
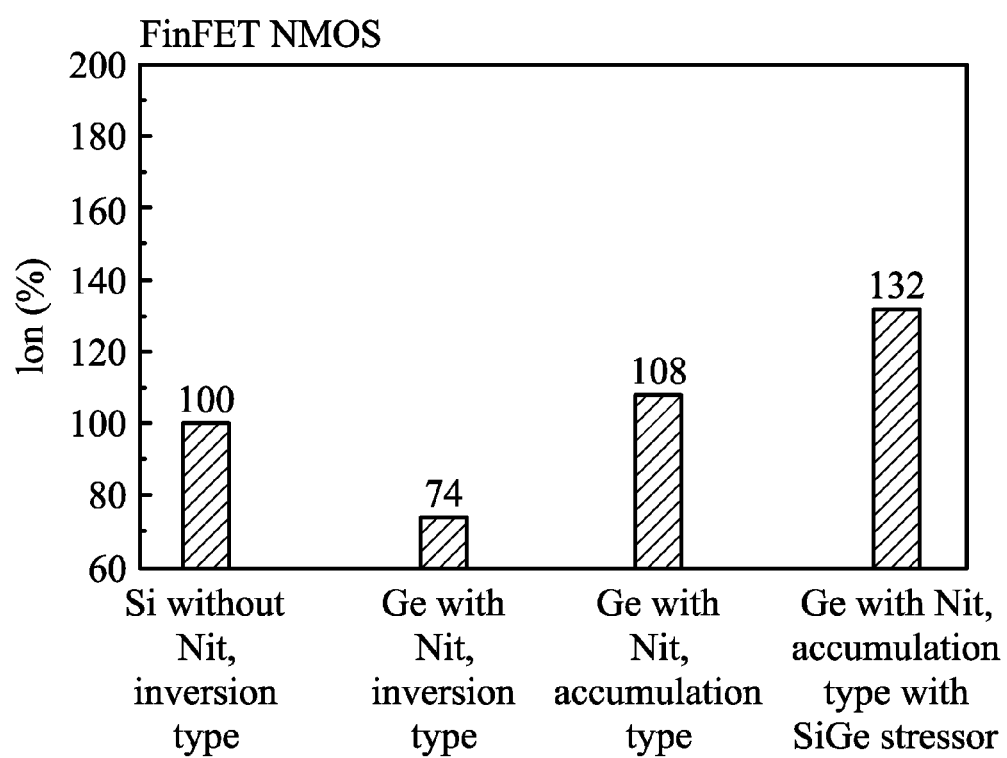
FIG. 2 illustrates a comparison of the turn-on current $I_{on}$ for embodiments of this embodiment and conventional devices.

FIG. 2 illustrates a comparison of the turn-on current $I_{on}$ of an exemplary Ge accumulation FinFET and exemplary conventional devices. The results shown assume 80% electron mobility degradation in NMOS at the Fin surface region due to interface defects (traps) Nit in Ge devices.

In FIG. 2 the turn-on current $I_{on}$ of a conventional inversion-type Si FinFET NMOS device without Nit is shown. The $I_{on}$ of Ge FinFET is normalized and compared to Si FinFET inversion-type. An inversion-type Ge FinFET NMOS device with Nit shows 74% $I_{on}$, due to the electron mobility degradation at the fin surface from Nit in Ge. In other words, compared to Si FinFET (inversion mode), −26% turn-on current $I_{on}$ degradation due to Nit is shown by TCAD simulation. The inversion-type Ge FinFET NMOS device is not accumulation-type and also has no stressors. However, with accumulation-type Ge FinFET NMOS device, the $I_{on}$ is increased to 108%, despite Nit in Ge. Therefore, by using accumulation-type channel, 34% $I_{on}$ gain can be realized, which means that Ge with accumulation channel is 8% $I_{on}$ higher than Si Fin-FET. Further, with the addition of a SiGe stressor, the performance is further enhanced to 132% $I_{on}$. In embodiments, desired surface passivation techniques can further reduce the Nit of the Ge accumulation-type FinFET.

In an accumulation-type device, narrower width of the fin region ($W_{fin}$) can suppress the turn-off leakage current $I_{off}$ and improve device performance affected by SCE/DIBL. In one embodiment, less than 30 nm fin width shows enhanced performance. In wide $W_{fin}$ and planar devices, high pocket doping is required and accumulation-channel can be hard to be realized.

Figure 3:
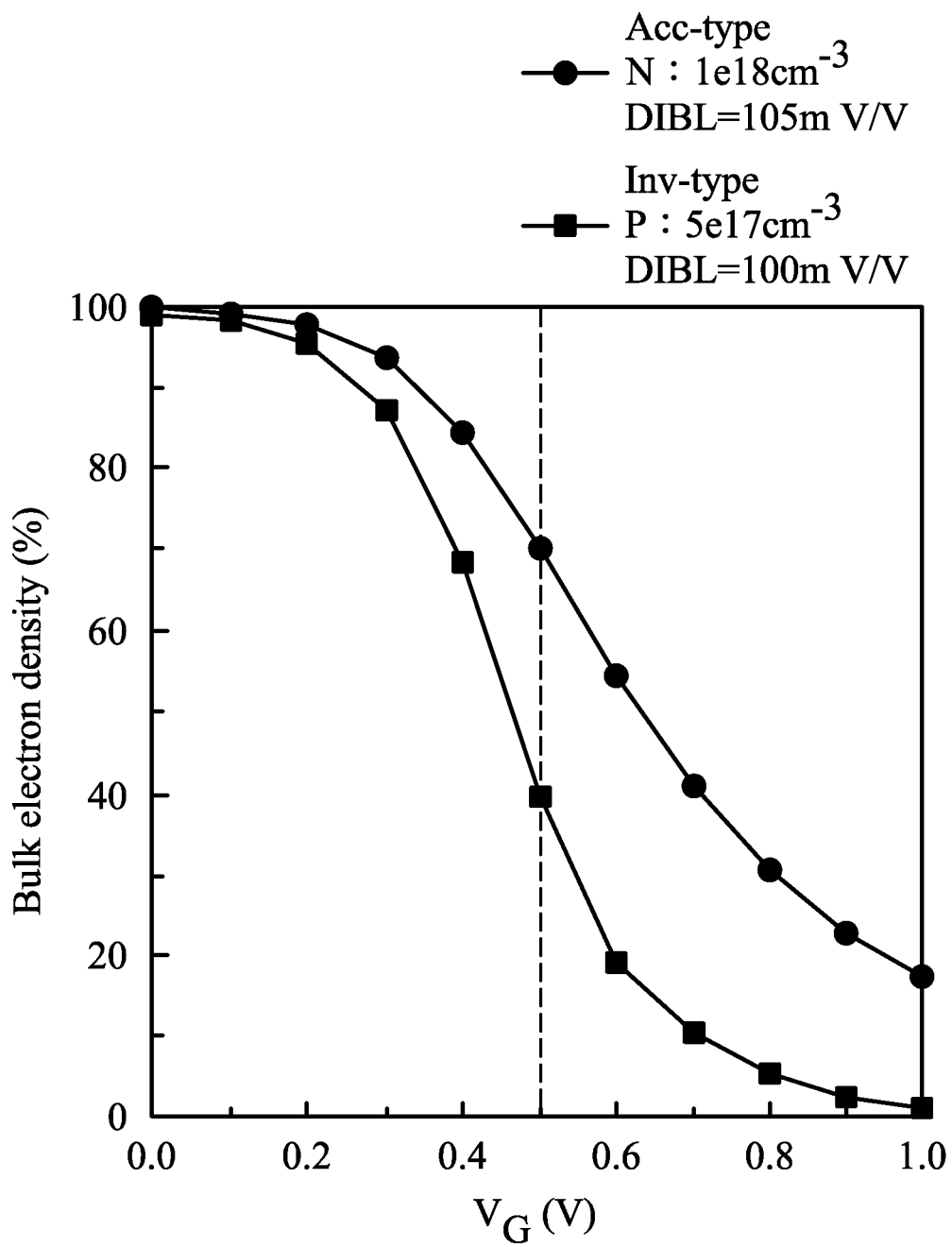
FIG. 3 illustrates a comparison of the bulk electron density for one embodiment of this embodiment and a conventional device.

Also, accumulation-type devices show higher electron density in the bulk region, especially in low VDD and $V_G$, e.g. 0.5V. FIG. 3 illustrates a comparison of the bulk electron density for one embodiment and a conventional device. In one embodiment, the accumulation-type Ge FinFET showed about 70% bulk electron density compared to the inversion type device with about 40% bulk electron density at $V_G$=0.5V, as shown in FIG. 3. The accumulation-type Ge FinFET NMOS device had the channel doping concentration of about 1e18 cm$^{-3}$ (N-type) and DIBL=105 mV/V, while the inversion-type device had the channel doping concentration of 5e18 cm$^{-3}$ (P-type).

Figure 4:
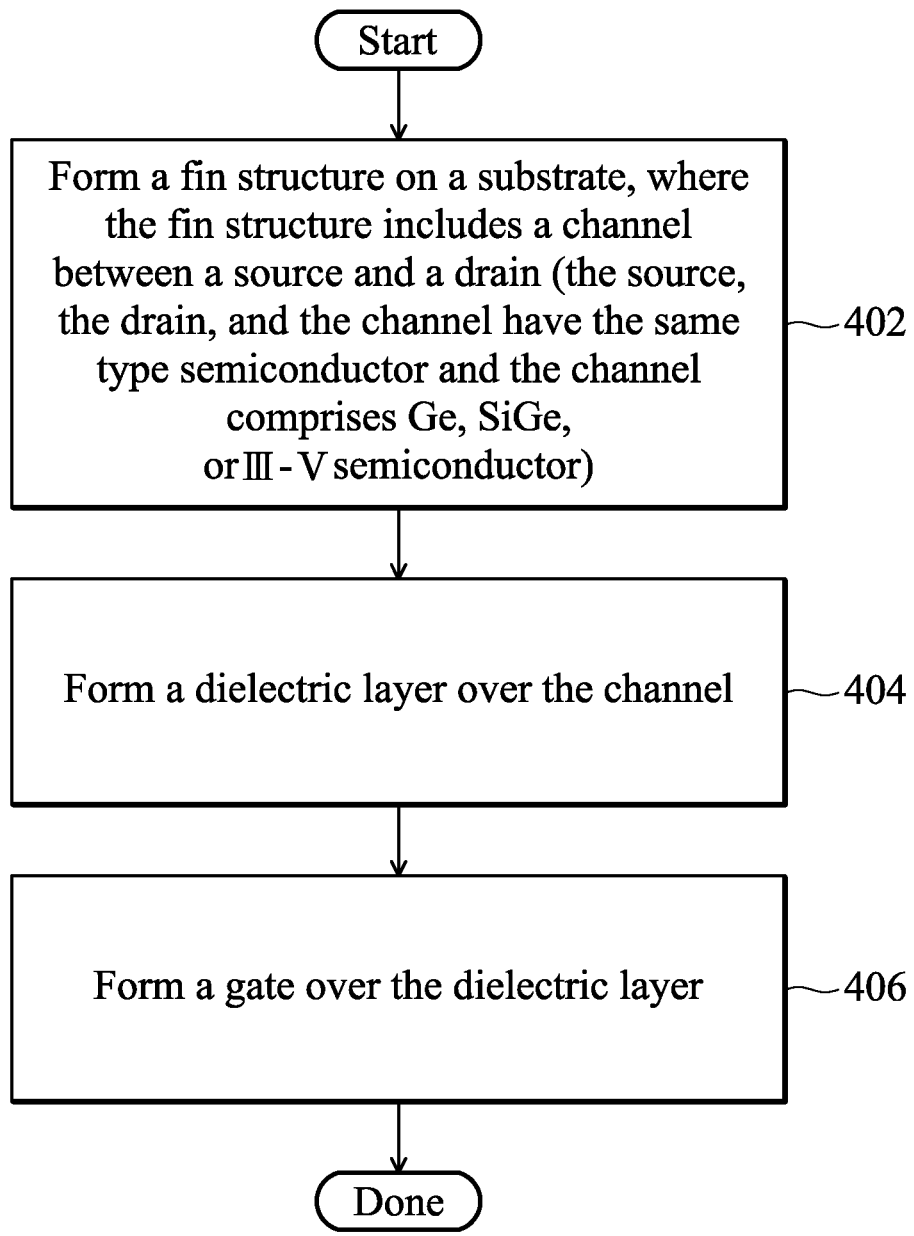
FIG. 4 illustrates a flow chart for a process to form an accumulation-type FinFET according to another aspect of this embodiment.

FIG. 4 illustrates a flow chart for a process to form a FinFET according to another embodiment. At step 402, a fin structure is formed on a substrate 120, where the fin structure includes a channel 108 between a source 106 and a drain 110 (the source 106, the drain 110, and the channel 108 have the same type semiconductor and the channel 108 comprises Ge, SiGe, or III-V semiconductor). At step 404, a gate dielectric layer 114 (e.g. oxide and/or a high-k dielectric) is formed over the channel 108. At step 406, a gate 116 is formed over the gate dielectric layer 114. The process can further comprise depositing and etching shallow trench insulation (STI) 118 layer that provides isolation from adjacent devices.

The process can further comprise forming a well 112 below the source 106, the drain 110, and the channel 108, wherein the well 112 has the second type dopant. The channel 108 can have a dopant concentration between about 1e18 cm−3 and about 3e18 cm−3. The gate 116 is capable of receiving a voltage, and the voltage is capable of shifting a Fermi-level of the channel toward a half of a bandgap of the channel. Forming the fin structure can comprise defining a width of the channel 108. In one embodiment, the width of channel 108 can be about 30 nm or less. At least one of the source 106 and the drain 110 comprises Ge, SiGe, or Si for NMOS. At least one of the source 106 and the drain 110 can comprise Ge, GeSn, SiGeSn or III-V semiconductor for PMOS.

Figure 5:
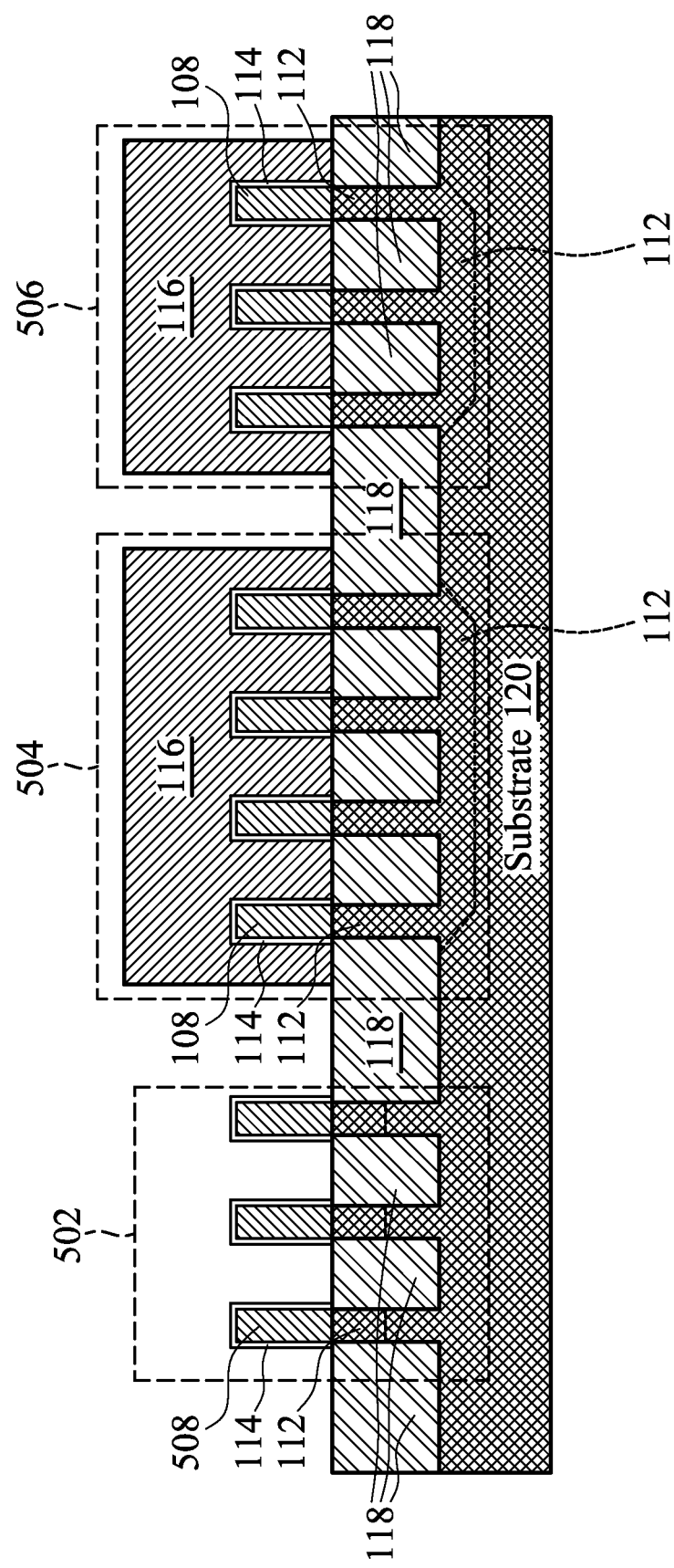
FIG. 5 illustrates cross sections of an integrated circuit including a dummy pattern and FinFET devices that have multiple accumulation type FinFET structures according to yet another aspect of the embodiment.

FIG. 5 illustrates cross sections of an integrated circuit including a dummy pattern and FinFET devices that have multiple accumulation type FinFET structures according to yet another embodiment. The integrated circuit comprises a substrate 120, a dummy pattern 502, and FinFET devices 504 and 506. The dummy pattern 502 includes at least one of a fin structure on the substrate. The fin structure comprises a channel 508 between the first source and the first drain. The source, the drain, and the channel 508 have the first type dopant. The well 112 providing electrical isolation from other devices can have the second type dopant.

FinFETs 504 and 506 on the substrate 120 also includes fin structures on the substrate 120. The fin structure includes the channel 108 between a source and a drain. The source, the drain, and the second channel 108 have the first type dopant. The channel 108 comprises Ge, SiGe, or III-V semiconductor. A gate dielectric layer 114 is located over the channel 108. And a gate 116 is located over the gate dielectric layer 114. In this embodiment, multiple channels 108 are used within one device.

The device has an accumulation channel, thus FinFET devices 504 and 506 have the channel 108, source, drain all the same type semiconductor, e.g. n-type/p-type for NMOS/PMOS respectively. The well 112 is p-type for NMOS and n-type for PMOS, and shallow trench isolation (STI) 118 are used as device-to-device electrical and physical isolation, respectively. Dummy pattern 502 without gate 116 can be also placed for better chemical mechanical planarization (CMP), etching, or fin-profile uniformity. The devices can be formed on Si or Ge substrate 120.

From the foregoing, the accumulation-type FinFET can provide a desired electron or hole mobility that can increase device performance. Leakage current, interface defects (traps), and SCE effects that previously degraded conventional Ge planar-type MOS device are free from affecting the present embodiments, by using accumulation-type FinFET architecture. The present embodiments apply not only to Ge channel, but also to SiGe, and other III-V channel material.

Further, the multi-fin within one device structure can provide a higher current per footprint. For example, since Ge and silicon have lattice mismatch, it is easier to grow good quality Ge epi layer in narrower fin width compared to wider fin width. The lattice mismatch induced stress can be relaxed in narrow fin and the Ge epi has less defects and dislocations. For example, if the fin width of 50 nm is used in prior Ge device, it can be divided into two fins with 25 nm. A skilled person in the art will appreciate that there can be many embodiment variations.

One aspect of this description relates to a fin field-effect-transistor (FinFET) including a substrate and a fin structure on the substrate. The fin structure includes a channel between a source and a drain, wherein the source, the drain, and the channel have a first type dopant, and the channel comprises at least one of a Ge, SiGe, or III-V semiconductor. The FinFET further includes a gate dielectric layer over the channel and a gate over the gate dielectric layer. The FinFET further includes a nitride spacer on the substrate adjacent the gate and an oxide layer between the nitride spacer and the gate and between the nitride spacer and the substrate.

Another aspect of this description relates to a method for forming a FinFET. The method includes forming a fin structure on a substrate. The fin structure including a channel between a source and a drain, wherein the source, the drain, and the channel have a first type dopant, and the channel comprises at least one of a Ge, SiGe, or III-V semiconductor. The method further includes forming a gate dielectric layer over the channel and forming a gate over the gate dielectric layer. The method further includes forming a nitride spacer on the substrate adjacent the gate and forming an oxide layer between the nitride spacer and the gate and between the nitride spacer and the substrate.

Still another aspect of this description relates to an integrated circuit including a substrate and a dummy pattern including at least one of a first fin structure on the substrate. The first fin structure includes a first channel between a first source and a first drain, wherein the first source, the first drain, and the first channel have a first type dopant. The integrated circuit further includes a fin field-effect-transistor (FinFET) including a second fin structure on the substrate. The second fin structure includes a channel between a source and a drain, wherein the source, the drain, and the channel have a first type dopant, and the channel comprises at least one of a Ge, SiGe, or III-V semiconductor. The FinFET further includes a gate dielectric layer over the channel and a gate over the gate dielectric layer. The FinFET further includes a nitride spacer on the substrate adjacent the gate and an oxide layer between the nitride spacer and the gate and between the nitride spacer and the substrate.

Although the present disclosure and its advantages have been described in detail, it should be understood that various changes, substitutions and alterations can be made herein without departing from the spirit and scope of the invention. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A fin field-effect-transistor (FinFET), comprising:
   a substrate;
   a fin structure on the substrate, the fin structure including a channel between a source and a drain, wherein the source, the drain, and the channel have a first type dopant, and the channel comprises at least one of a Ge, SiGe, or III-V semiconductor;
   a gate dielectric layer over the channel;
   a gate over the gate dielectric layer;
   a nitride spacer on the substrate adjacent the gate; and
   an oxide layer between the nitride spacer and the gate and between the nitride spacer and the substrate.

2. The FinFET of claim 1, wherein a doping concentration of the channel is lower than a doping concentration of the source and the drain.

3. The FinFET of claim 1, further comprising a first silicide layer over the source and a second silicide layer over the drain.

4. The FinFET of claim 3, wherein the nitride spacer extends over a top surface of the first and second silicide layers.

5. The FinFET of claim 1, further comprising a well region that has a second type dopant below the source, the drain, and the channel.

6. The FinFET of claim 5, further comprising at least one isolation feature adjacent to the well region below the source, the drain and the channel.

7. The FinFET of claim 1, wherein the source and the drain are configured to induce tensile stress in the channel.

8. A method for forming a FinFET, comprising:
   forming a fin structure on a substrate, the fin structure including a channel between a source and a drain, wherein the source, the drain, and the channel have a first type dopant, and the channel comprises at least one of a Ge, SiGe, or III-V semiconductor;
   forming a gate dielectric layer over the channel;
   forming a gate over the gate dielectric layer
   forming a nitride spacer on the substrate adjacent the gate; and
   forming an oxide layer between the nitride spacer and the gate and between the nitride spacer and the substrate.

9. The method of claim 8, wherein forming the fin structure comprises doping the source and the drain with a higher doping concentration than the channel.

10. The method of claim 8, further comprising forming a first silicide layer over the source and forming a second silicide layer over the drain.

11. The method of claim 10, wherein forming the nitride spacer comprises forming the nitride spacer over a top surface of the first and second silicide layers.

12. The method of claim 8, further comprising forming a well region that has a second type dopant below the source, the drain, and the channel.

13. The method of claim 12, further comprising forming at least one isolation feature adjacent to the well region below the source, the drain and the channel.

14. The method of claim 8, wherein forming the fin structure comprises inducing a tensile stress in the channel.

15. An integrated circuit, comprising:
   a substrate;
   a dummy pattern including at least one of a first fin structure on the substrate, the first fin structure comprising a first channel between a first source and a first drain, wherein the first source, the first drain, and the first channel have a first type dopant; and
   a FinFET over the substrate, the FinFET including:
      a second fin structure on the substrate, the second fin structure including a channel between a source and a drain, wherein the source, the drain, and the channel have a first type dopant, and the channel comprises at least one of a Ge, SiGe, or III-V semiconductor;
      a gate dielectric layer over the channel;
      a gate over the gate dielectric layer;
      a nitride spacer on the substrate adjacent the gate; and
      an oxide layer between the nitride spacer and the gate and between the nitride spacer and the substrate.

16. The integrated circuit of claim 15, wherein a doping concentration of the channel is lower than a doping concentration of the source and the drain.

17. The integrated circuit of claim 15, further comprising a first silicide layer over the source and a second silicide layer over the drain.

18. The integrated circuit of claim 17, wherein the nitride spacer extends over a top surface of the first and second silicide layers.

19. The integrated circuit of claim 15, further comprising:
   a well region that has a second type dopant below the source, the drain, and the channel; and
   at least one isolation feature adjacent to the well region below the source, the drain and the channel.

20. The integrated circuit of claim 15, wherein the source and the drain are configured to induce tensile stress in the channel.

* * * * *